United States Patent [19]
Whisler et al.

[11] Patent Number: 5,794,327
[45] Date of Patent: Aug. 18, 1998

[54] METHOD FOR MAKING COPPER ELECTRICAL CONNECTIONS

[75] Inventors: Richard E. Whisler, Seminole; Larry Lee Wysong, St. Petersburg, both of Fla.

[73] Assignee: Bird Electronic Corporation, Solon, Ohio

[21] Appl. No.: 611,220

[22] Filed: Mar. 5, 1996

[51] Int. Cl.$^6$ ................ H01C 17/06; H01R 9/00
[52] U.S. Cl. ................ 29/620; 29/843; 174/94 R; 174/261; 228/248.1; 228/262.61
[58] Field of Search ............. 29/620, 843; 174/94 R, 174/261; 228/179.1, 180.1, 220, 262.6, 262.61

[56] References Cited

U.S. PATENT DOCUMENTS

| | | | |
|---|---|---|---|
| 4,070,619 | 1/1978 | Trefney | 324/95 |
| 4,127,934 | 12/1978 | Bartley et al. | 29/626 |
| 4,132,341 | 1/1979 | Bratschun | 228/122 |
| 4,220,810 | 9/1980 | Arai et al. | 174/68.5 |
| 4,801,067 | 1/1989 | Kondo et al. | 228/123 |
| 4,815,981 | 3/1989 | Mizuno | 439/77 |
| 4,889,980 | 12/1989 | Hara et al. | 235/488 |
| 5,060,052 | 10/1991 | Castro et al. | 57/74 |
| 5,093,986 | 3/1992 | Mandai et al. | 29/843 |
| 5,098,863 | 3/1992 | Dolezal et al. | 437/211 |
| 5,138,429 | 8/1992 | Nagesh et al. | 357/70 |
| 5,243,320 | 9/1993 | Clouser et al. | 338/308 |
| 5,279,028 | 1/1994 | McKee et al. | 29/843 |

FOREIGN PATENT DOCUMENTS

| | | |
|---|---|---|
| 0278741 | 2/1988 | European Pat. Off. |
| 1539669 | 1/1979 | United Kingdom. |

OTHER PUBLICATIONS

IBM Technical Disclosure Bulletin, Vo. 11, No. 7, Dec. 1968.
International Search Report for Application No. PCT/US97/03995 dated Jul. 30, 1997.

*Primary Examiner*—P. W. Echols
*Attorney, Agent, or Firm*—Rankin, Hill, Porter & Clark LLP

[57] ABSTRACT

A method for making electrical connections between a lead and a conductor on a substrate, the method including the steps of disposing a copper conductor on a ceramic substrate; positioning a lead in contact with the conductor; applying a copper film to the lead and the conductor to attach the lead to the conductor; and heating the substrate, lead and conductor assembly to secure bond the lead and conductor together. In a preferred embodiment, the conductor, lead and film are made of copper. The method can further include disposing a resistive film of the substrate using thin or thick film processes.

5 Claims, 1 Drawing Sheet

METHOD FOR MAKING COPPER ELECTRICAL CONNECTIONS

BACKGROUND OF THE INVENTION

The invention relates generally to making electrical connections to electrical circuits disposed on a substrate, and more particularly to methods for making electrical connections between a lead and an electrically conductive element such as a conductor disposed on the substrate.

A well known technique for making electrical connections to substrate mounted circuits is to solder a lead to a thick film silver based conductor disposed on the substrate. For example, inks are available, such as made of silver and platinum or silver and palladium alloys, for forming conductors on a substrate by printing or silk screening techniques. These inks can typically be fired in normal air atmosphere. Gold based alloys are also available.

Although silver based conductors with soldered leads tend to be the lowest cost approach, the relatively low temperature bond between the lead and the conductor can be weakened or broken under normal soldering times and temperatures when the user installs the part (i.e. when the customer solders another component to the lead). Even if the connection is not broken, solder reflow is possible and may result in lead movement during installation. Such normal soldering operations can also result in the conductor leaching off the substrate.

Another known approach involves the use of molybdenum manganese (moly/mag) conductor technology. Although moly/mag conductors exhibit good adhesion to conventional ceramic substrates such as are made of BeO (beryllium oxide), and further permit the use of thin film resistors, the moly/mag technology uses cracked hydrogen to fire the parts. Additionally, parts must be soldered or brazed to the assembly, and in order to solder parts such as a lead to a moly/mag conductor, the moly/mag conductor must be plated such as with nickel or copper.

Still another known technique is direct bond copper technology in which the lead is the same piece of copper as the conductor. However, substrates with direct bond copper conductors on them are not widely produced and are very expensive. Additionally, the direct bond copper conductor/lead can present a raised and sharp edge that can damage the screens used to print other components on the substrate, such as resistors.

The objectives exist, therefore, for an improved method of making electrical connections between a lead and a substrate mounted conductor. Such a method will preferably provide a high temperature bond between the lead and the conductor so that normal soldering operations during installation will not result in lead movement or separation or cause damage to the conductor attachment to the substrate. Such a method will preferably be compatible with additional processing such as screening resistors or other components onto the substrate. Still further, such method will preferably be cost effective compared with competing technologies.

SUMMARY OF THE INVENTION

The present invention contemplates a significant departure from conventional technologies by providing in one embodiment, a method for making electrical connections between a lead and a conductor on a substrate, comprising the steps of:

a) disposing a copper conductor on a ceramic substrate;
b) positioning a lead in contact with the conductor;
c) applying a copper film to the lead and the conductor to attach the lead to the conductor; and
d) heating the substrate, lead and conductor assembly to bond the lead and conductor together.

The invention further contemplates the structure or product made by the practice of the claimed method.

These and other aspects and advantages of the present invention will be readily understood and appreciated by those skilled in the art from the following detailed description of the preferred embodiments with the best mode contemplated for practicing the invention in view of the accompanying drawings.

DETAILED DESCRIPTION OF THE INVENTION

Figure 1:
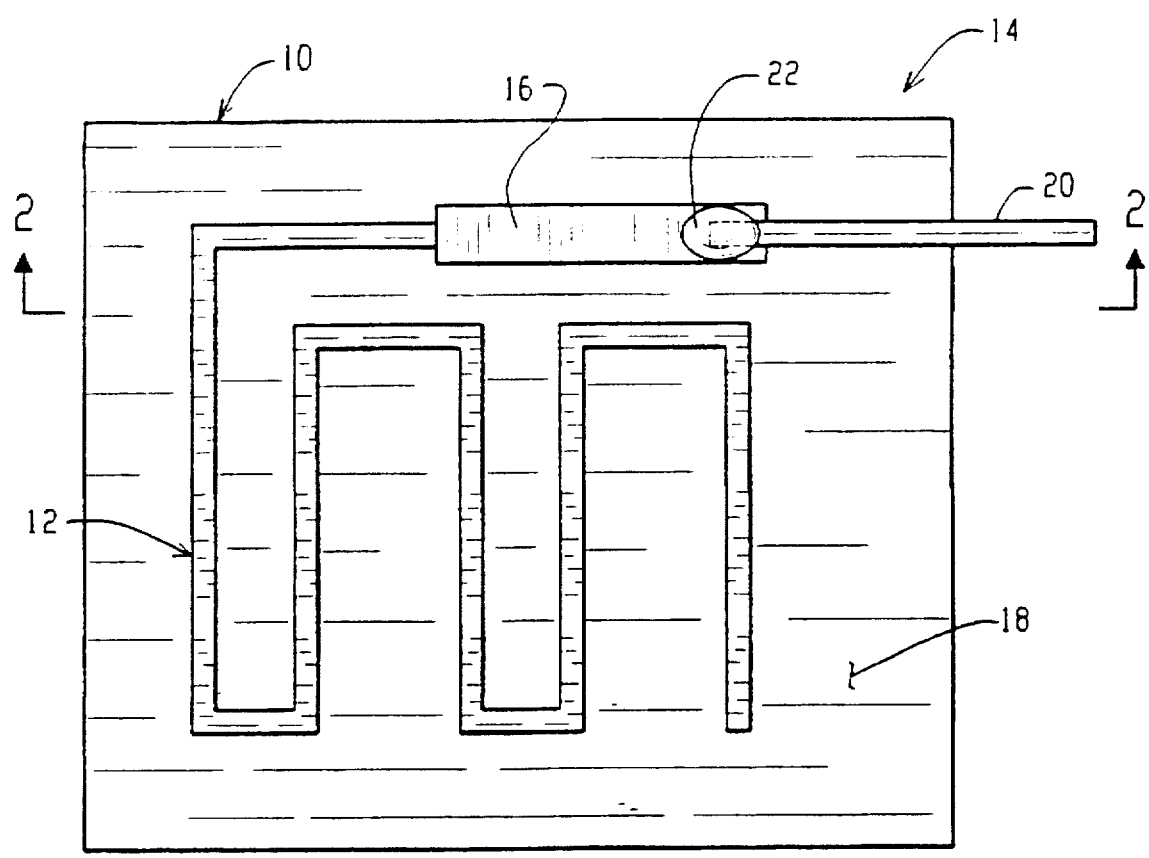
FIG. 1 is a simplified plan schematic representation of a substrate assembly that embodies the concepts of the present invention.
Figure 2:
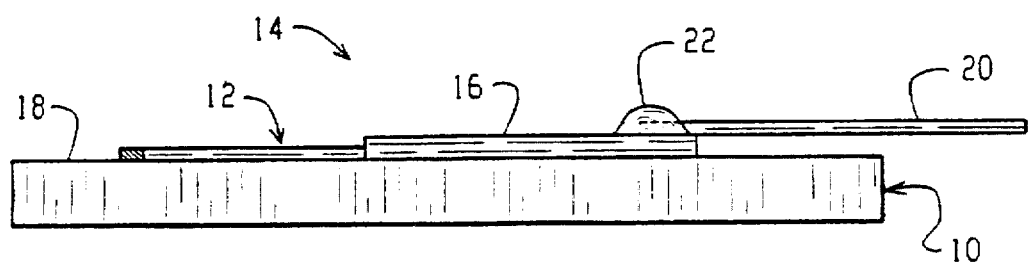
FIG. 2 is a elevation in partial cross section taken along the line 2—2 in FIG. 1.

With reference to the drawings, an embodiment of an assembly that embodies the teachings of the invention is illustrated in simplified form, with relative dimensions being exaggerated for clarity. In this embodiment, a substrate 10 carries one or more electrical components or elements 12 as part of an overall electrical assembly 14. In this example, the component 12 comprises a resistive film that functions, for example, as a resistor or impedance when connected to a circuit by the user (not shown). While the invention is described herein with particular reference to making electrical connection to a resistance, those skilled in the art will readily appreciate that the invention can conveniently be used for making electrical connection to any number of different types of components on a substrate. Thus, the invention is more broadly directed to methods for making electrical connections, rather than to the specific type of circuit that the invention is used with.

In the described embodiment, it will be assumed that the end user of the assembly 14 needs to make an electrical contact or connection with the resistive element 12. In this example, the substrate 10 is made of BeO, and an electrical conductor 16 made of a thick copper film is printed by conventional methods onto a surface 18 of the substrate 10. Other materials for the substrate can be used, such as, for example, alumina. The thick film copper conductor can be, for example, 0.060 in. width and 0.0008 in. thickness, and preferably is in the range of 0.0005 to 0.0015 in. A suitable commercial technique for printing the conductor 16 onto the substrate is by screen printing with copper conductor thick film ink. The terms "ink" or "paste" are used interchangeably herein when referring to the material used to apply copper either to the substrate 10 to form the conductor 16, or to attach a lead to the conductor 16, as will be described hereinafter. Such inks or pastes are generally thick film technology. Suitable pastes for the conductor 16 include C7320 multilayer copper conductor paste available from Heraeus Incorporated, Cermalloy Division; and QP153 Copper Conductor available from DuPont Electronics. As used generally herein, a conductor paste typically exhibits a resistivity under about 1 ohm per square.

A suitable alternative material for the substrate is alumina ($Al_2O_3$), for example, and it is contemplated that the invention can be used with other substrate materials also.

After the conductor 16 is disposed on the substrate 10, the assembly 14 is fired, such as in an oven, by the application of sufficient heat to solidly bond the conductor 16 to the substrate. The firing occurs in an inert atmosphere, such as, for example, nitrogen, as is known to those skilled in the art. In the example herein, the assembly 14 can be fired at a temperature of about 900° C. for ten minutes, and preferably within the ranges of 865° to 930° C. for eight to fifteen minutes.

Those skilled in the art will readily appreciate that the firing times and temperatures will depend on the specific materials and compositions of the materials used for the substrate 14 and the conductor 16, as well as the mass of the assembly 14. For example, although the invention is described herein with specific reference to a single substrate that carries a resistance 12, it will be appreciated that the process and methods described herein can be applied to a laser scribed ceramic substrate having a plurality of substrates that can be broken apart after processing in order to achieve economies of scale.

After the conductor 16 and substrate 10 assembly 14 is fired, a lead 20 is attached to the conductor 16 by placing them in contact with each other and applying a copper film 22 to the connection therebetween. The copper film 22 is preferably applied as a thick copper film, such as by applying a copper ink or paste using a brush. The same ink or paste used for the copper conductor 16 can be conveniently used for the film 22. An alternative approach would be to print screen the film 22 onto the connection between the conductor 16 and the lead 20. Still a further exemplary alternative is to apply the ink using a power syringe. Preferably, the lead is made of copper, thus forming an all copper electrical connection that includes the conductor 16, the lead 20 and the copper film 22.

The assembly 14, which now includes the substrate 10, the conductor 16, the lead 20 and the film 22, is then fired a second time in nitrogen for example, this time at a very high temperature about 900° C., to form a solid copper bond between the conductor 16 and the lead 20. Preferably, the assembly is fired in the range of 865° to 930° C.

This high temperature bond of the lead 20 to the conductor 16 permits soldering operations to be performed during installation without affecting the electrical and mechanical connection between the lead 20 and the conductor 16. Since the electrical connection is all copper, there also is no solder reflow or leaching. The all copper connection between the conductor 16 and the lead 20 also presents a high strength and thus highly reliable connection. Another advantage realized from the present invention is that the copper conductor 16 exhibits better adhesion to a BeO substrate than a conventional silver conductor.

After the assembly 14 has been fired the second time, the resistive film 12, such as available using a resistor ink, can be applied to the substrate 10 by conventional processes, such as, for example, print screening. Preferably, the ink is tantalum nitride or lanthanum boride. Suitable materials for the resistive film 12 include the R85X1 resistor series available from Haraeus Incorporated, Cermalloy Division; and QP60 series resistors available from DuPont Electronics. These particular resistive films are conveniently fired in a nitrogen atmosphere also. As used generally herein, a resistive film typically exhibits a resistivity greater than about 1 ohm per square. Those skilled in the art will appreciate that the resistivity of the film 12 can be controlled by mixing conductor and resistive pastes and inks to achieve the desired resistivity for a specific application. The resistive film 12 is applied so as to make electrical contact with the conductor 16 (already disposed on the substrate 10). Since the conductor 16 and lead 20 form a single piece at this point, there are no sharp edges and raised corners to damage the screen used to print the resistor 12 on the substrate. After the resistor ink dries, the final assembly 14 is fired a third time, which bonds the resistor film 12 to the substrate as well as to the conductor 16. The resulting product includes a resistor 12 disposed on a ceramic substrate 10 that can be electrically connected during installation via the copper bonded lead 20, such as by conventional soldering techniques, without damaging the electrical connection between the lead 20 and the conductor 16.

Those skilled in the art will appreciate that in cases where tantalum nitrite is used for resistive film 12, the film 12 can be applied using either thick film or thin film technology. As a thick film, the resistor 12 can be print screened onto the substrate 10 either after the lead 20 is attached as just described, or alternatively can be print screened onto the substrate 10 before the lead 20 is attached to the conductor. In this alternative order of steps, an advantage is that the resistive film 12 can be applied to the substrate without the presence of the lead 20 possibly interfering with the screen. The film 12 can be dried first and then the assembly 14 fired a second time (the first time being the conductor 16 fired to the substrate 10). The lead 20 can then be attached as described hereinabove and the assembly 14 fired a third time.

In still another alternative process, after the conductor 16 is disposed on the substrate 14 and fired, the resistive film 12 is applied to the substrate 14, such as by print screening, for example. The resistive ink is allowed to dry, but the assembly 14 is not fired at this point. Instead, the copper lead 20 is attached to the conductor 16 as described hereinbefore, such as by brushing or using a power syringe to apply a copper film over the juncture or print screening a copper film to join the conductor 16 and the lead 20. Then, the entire assembly 14, including the substrate 10, the resistive element 12, the conductor 16 and the attached lead 20, is fired in the nitrogen atmosphere at about 900° C., preferably in the range of 865° to 930° C. This single firing bonds the resistive element 12 to the substrate and the conductor 16, as well as providing the high temperature all copper bond between the lead 20 and the conductor 16, thus resulting in the same end product as the first described method.

The present invention is also suited for the use of thin film and thick film technologies on the same substrate 10. For example, tantalum nitrite or lanthium boride resistors can be applied using thick or thin film technologies. Another material suited for thin film application of the resistive film 12 is nichrome. Examples of the thick film applications have been given hereinabove. For thin film technology, the resistive film 12 is applied after the assembly 14 has undergone the final firing. For example, the conductor 16 is applied to the substrate 10 as described above and the assembly fired a first time. Then the lead 20 is attached as described above and the assembly fired a second time. Or alternatively, a single firing step can be used for the conductor 16 and the lead attachment. In either case, after the assembly is fired for the last time, the thin resistive film 12 can be applied by any of a number of known techniques such as by vacuum deposition or sputtering. These processes typically involve the use of a mask as is known to set the pattern deposited on the substrate. The thin film resistor 12 is applied after the last firing because if the assembly 14 is fired with a thin film resistor on the substrate, the thin film will evaporate.

The invention thus provides method and product by method for making electrical connections to substrate mounted components wherein a lead is bonded to a conductor on the ceramic substrate without solder. Although the preferred embodiment described herein discloses the use of copper conductor, copper lead and thick film copper to join the two, such description is exemplary in nature and should not be construed in a limiting sense. Other materials than copper may be used for the lead 20, and other materials for the thick film 22 and the conductor 16 can also be used. The materials chosen will depend on the substrate and the actual connection characteristics desired, to effect a high temperature bond between the lead and the conductor that will not be deleteriously affected by subsequent soldering operations during installation.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. A method for making an electrical connection between a lead and a conductor on a substrate, comprising, in sequence, the steps of:

a.) disposing a copper conductor on a ceramic substrate;

b.) positioning a copper lead in contact with said conductor;

c.) applying a copper film to the lead and the conductor to attach the lead to the conductor.; and d.) heating the substrate, lead and conductor assembly to form a high temperature, solid copper bond between the lead, film and conductor so that subsequent soldering operations may be performed without damage to the connection.

2. The method of claim 1 wherein the step of heating is performed at a temperature substantially higher than temperatures the lead is exposed to during later processing and installation of the assembly.

3. The method of claim 1 wherein the substrate is made of BeO or alumina.

4. The method of claim 1 further comprising the step of disposing a resistive film on the substrate using a thick film process, the resistive film being in electrical contact with the conductor.

5. The method of claim 1 further comprising the step of disposing a resistive film on the substrate using a thin film process, the resistive film being in electrical contact with the conductor.

* * * * *